(12) United States Patent
Itoh et al.

(10) Patent No.: US 8,435,045 B2
(45) Date of Patent: May 7, 2013

(54) ELECTRICAL CONNECTING APPARATUS AND METHOD FOR MANUFACTURING THE SAME

(75) Inventors: Tatsuya Itoh, Oita (JP); Shogo Mizutani, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 45 days.

(21) Appl. No.: 13/310,488

(22) Filed: Dec. 2, 2011

(65) Prior Publication Data

US 2012/0149218 A1 Jun. 14, 2012

(30) Foreign Application Priority Data

Dec. 14, 2010 (JP) .................................. 2010-277910

(51) Int. Cl.
*H01R 12/00* (2006.01)
(52) U.S. Cl.
USPC .......................................................... 439/66
(58) Field of Classification Search .................... 439/66, 439/67; 324/754, 758, 761, 760
See application file for complete search history.

(56) References Cited

U.S. PATENT DOCUMENTS

| | | | | |
|---|---|---|---|---|
| 5,399,982 A | * | 3/1995 | Driller et al. ............. | 324/750.25 |
| 5,461,326 A | * | 10/1995 | Woith et al. .............. | 324/750.25 |
| 7,063,542 B2 | * | 6/2006 | Weiss et al. ..................... | 439/67 |
| 7,071,715 B2 | * | 7/2006 | Shinde et al. ............ | 324/756.03 |
| 7,641,481 B2 | * | 1/2010 | Trobough ........................ | 439/70 |
| 7,819,668 B2 | * | 10/2010 | Narita et al. ..................... | 439/66 |
| 2003/0003780 A1 | * | 1/2003 | Johnson et al. .................. | 439/67 |
| 2006/0057866 A1 | * | 3/2006 | Mirsky et al. ................... | 439/66 |
| 2006/0261826 A1 | * | 11/2006 | Ito .................................. | 324/754 |
| 2009/0189624 A1 | * | 7/2009 | Oh et al. ........................ | 324/754 |
| 2012/0149218 A1 | * | 6/2012 | Itoh et al. ........................ | 439/78 |

FOREIGN PATENT DOCUMENTS

| | | |
|---|---|---|
| JP | 2008-145238 | 6/2008 |
| JP | 2009-162483 | 7/2009 |

* cited by examiner

*Primary Examiner* — James Harvey
(74) *Attorney, Agent, or Firm* — Ingrassia Fisher & Lorenz, P.C.

(57) ABSTRACT

The present invention heightens positional accuracy of a plurality of conductive paths provided in a resilient connecting board and having connected thereto a plurality of probes. An electrical connecting apparatus includes a connecting board and a plurality of probes arranged on a lower side of the connecting board. The connecting board includes a first board having resiliency, a first sheet-like member arranged on a lower side of the first board, and a plurality of conductive paths passing through the first sheet-like member in an up-down direction. The probes are connected to lower ends of the conductive paths. The first sheet-like member is made of a photosensitive resin.

9 Claims, 8 Drawing Sheets

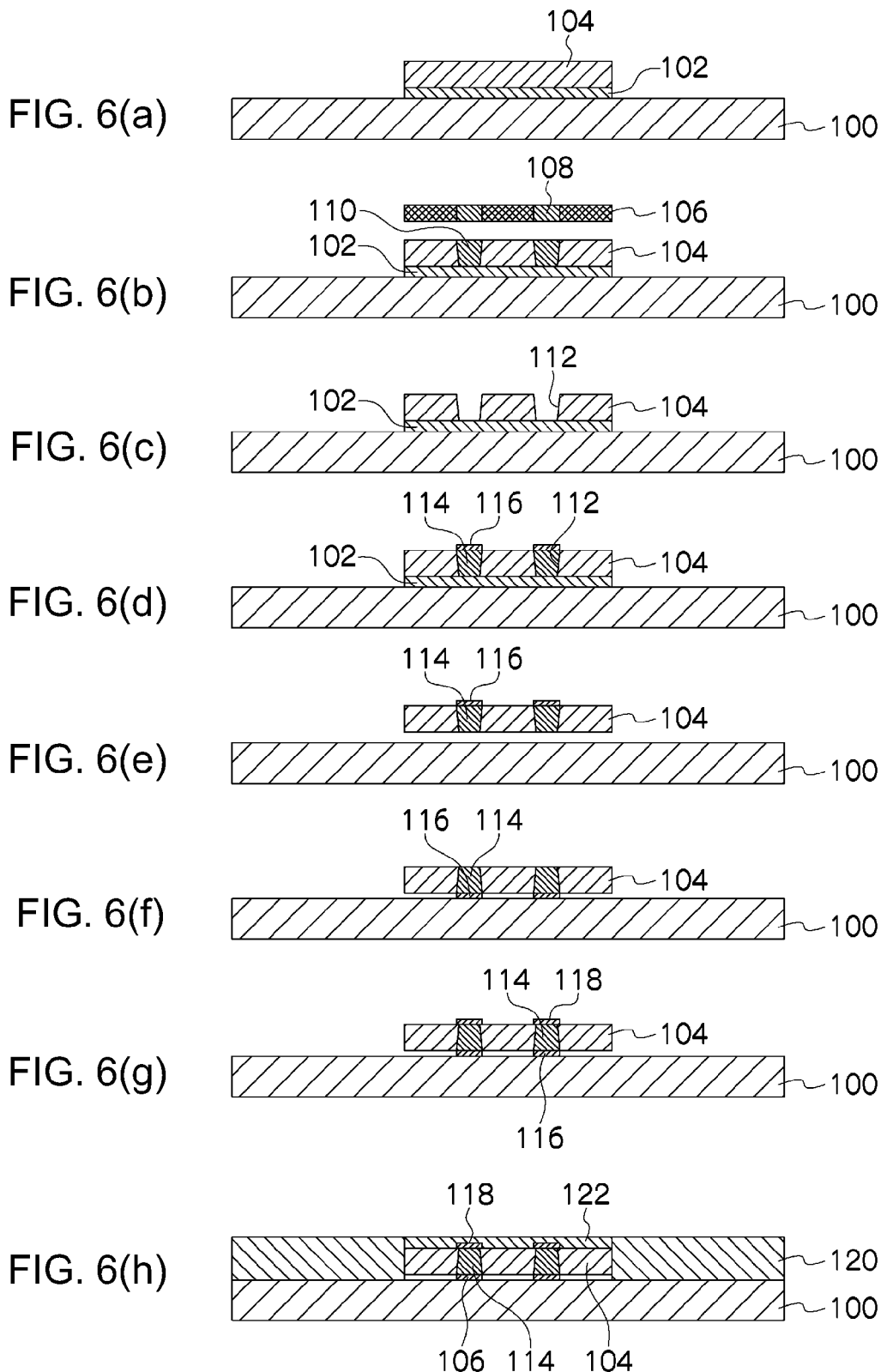

ELECTRICAL CONNECTING APPARATUS AND METHOD FOR MANUFACTURING THE SAME

RELATED APPLICATION

This application claims the benefit of, and claims priority to, Japanese patent application number 2010-277910, filed on Dec. 14, 2010.

1. Technical Field

The present invention relates to an electrical connecting apparatus such as a probe card for use in an electrical test of a device under test such as a semiconductor wafer having formed therein integrated circuits, light emitting elements, light receiving elements, or the like and a method for manufacturing the same.

2. Background Art

Multiple semiconductor integrated circuits formed on a semiconductor wafer or a device under test undergo an electrical test (that is, an inspection) to determine whether or not they are manufactured in accordance with the specification before being separated into respective chips. In this electrical test, an electrical connecting apparatus having electrical testing probes to be connected to electrodes of a device under test is used, and the device under test is connected to an electrical circuit of a tester via the electrical connecting apparatus.

As one of conventional electrical connecting apparatuses, there is an electrical connecting apparatus including a plate-shaped wiring board having a plurality of wires to be electrically connected to a tester, a connecting board attached to the lower surface of the wiring board, and a probe assembly attached to the lower side of the connecting board and having a plurality of probes (that is, contacts) (Patent Literature 1).

The connecting board is made of an insulating material such as polyimide, has a plurality of internal wires covered with such an insulating material, and electrically connects the wires of the wiring board to the probes of the probe assembly by the internal wires.

Each of the internal wires has a first exposed portion or a first terminal exposed to the lower surface, and the upper end of the probe abuts on the first terminal. The internal wire also has a second exposed portion or a second terminal exposed to the upper surface, and the second terminal is connected to the wire of the wiring board. Also, the connecting board is a so-to-speak flexible printed board made of an insulating material such as polyimide in a sheet form and is resilient. This facilitates an attaching work to the wiring board so that the second terminals may be connected to the wires.

In this conventional technique, for the purpose of forming on the connecting board the first terminals on which the probes are to abut, holes reaching the internal wires from the surface of the connecting board are formed by a laser process to cause parts of the internal wires to be exposed.

However, in the laser process, the work is troublesome, and the process cost is expensive. Also, since positions corresponding to the plurality of first terminals are irradiated with laser one by one, misalignment of each laser irradiation causes enlargement of mutual misalignment among the plural exposed parts, that is, the first terminals, of the internal wires. This complicates a work of attaching the probes to the connecting board so that the probes may abut on the first terminals and so that the probe tip positions of the probes may be at predetermined positions.

Citation List and Patent Literature
Patent Literature: PTL 1 Japanese National Patent Appln. Public Disclosure No. 2009-162483

SUMMARY OF INVENTION

It is an object of the present invention to heighten positional accuracy of a plurality of conductive paths provided in a resilient connecting board and having connected thereto a plurality of probes.

An electrical connecting apparatus according to the present invention includes a connecting board and a plurality of probes arranged on a lower side of the connecting board. The connecting board includes a first board having resiliency, a first sheet-like member arranged on a lower side of the first board, and a plurality of conductive paths passing through the first sheet-like member in an up-down direction.

The first board has a plurality of first internal wires, and upper ends of the conductive paths are connected to the first internal wires. The probes are connected to lower ends of the conductive paths. The first sheet-like member is made of a photosensitive resin.

The electrical connecting apparatus may further include a second board arranged on an upper side of the connecting board and having a plurality of second internal wires, and the first internal wires may be connected to the second internal wires. Also, the electrical connecting apparatus may include a case arranged on a lower side of the connecting board and having arranged therein the probes.

The case may include a first box-shaped member having a first plate-shaped portion, a plate-shaped member having a second plate-shaped portion spaced on a lower side of the first plate-shaped portion, and a second box-shaped member having a third plate-shaped portion spaced on a lower side of the second plate-shaped portion.

The first, second, and third plate-shaped portions may be coupled in a state of being spaced in an up-down direction, and each probe may extend downward from the lower end of the conductive path and penetrates the first, second, and third plate-shaped portions. The conductive path may be formed in a truncated pyramidal shape that is broader further on a lower side, and the conductive path may have a broader bottom surface than a connecting portion of the probe to the lower end.

A method for manufacturing an electrical connecting apparatus according to the present invention includes a first step of forming a plurality of first through holes passing through a first sheet-like member at a time, a second step of filling a first metal material in the first through holes, and a third step of forming on the first sheet-like member a first board having resiliency. The first through holes are formed in the first sheet-like member made of a photosensitive resin with use of a photolithographic technique. The first board has a plurality of first internal wires to be electrically connected to the first metal material.

The first board may have a second sheet-like member lying between the first internal wires and the first sheet-like member. The third step may include a fourth step of forming second through holes passing through the second sheet-like member in an up-down direction at positions corresponding to the first metal material and a fifth step of filling in the second through holes a second metal material to be electrically connected to the first metal material. The fourth step may include forming the second through holes in the second sheet-like member by a laser process.

The method may further include a sixth step of forming on an upper surface of the second sheet-like member the first internal wires to be electrically connected to the first metal material via the second metal material and between the second and third steps a seventh step of turning the first sheet-like member upside down.

With the present invention, the conductive paths to which the plurality of probes are connected are provided so as to pass through the first sheet made of the photosensitive resin in the up-down direction. That is, the plurality of conductive paths can be formed in the first photosensitive sheet with use of the photolithographic technique.

Since positional accuracy of the plurality of conductive paths depends on pattern accuracy of a photolithographic mask used in the photolithographic technique, the plurality of conductive paths can be formed with high positional accuracy. Arranging the plurality of conductive paths with high positional accuracy facilitates a work of attaching the plurality of probes to the connecting board so that the respective probes may abut on the conductive paths and so that probe tip positions of the respective probes may be at predetermined positions.

BRIEF DESCRIPTION OF DRAWINGS

FIG. 6 describes steps of manufacturing the electrical connecting apparatus according to the present invention.

DESCRIPTION OF EMBODIMENTS

Description of Terms

Figure 1:
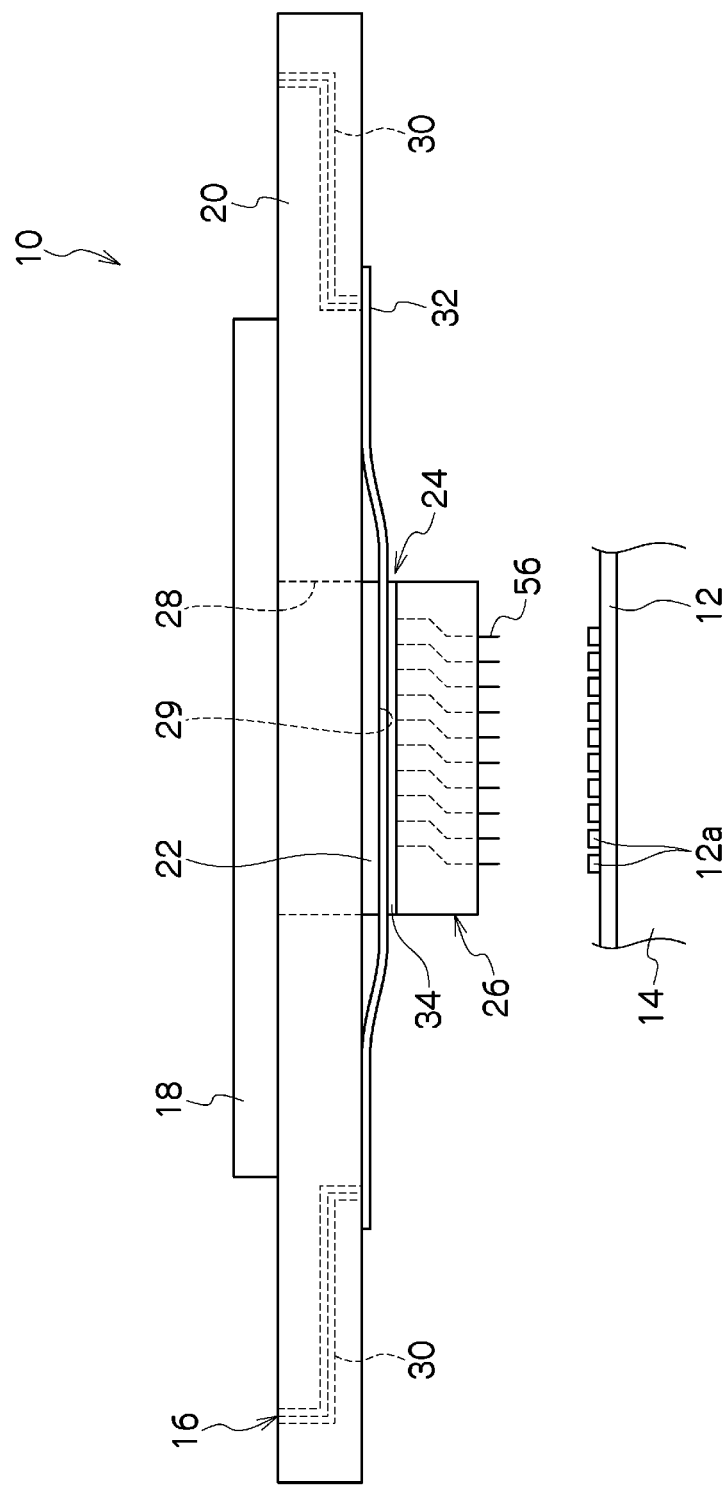
FIG. 1 is a front view showing an embodiment of a testing system with use of an electrical connecting apparatus according to the present invention.
Figure 2:
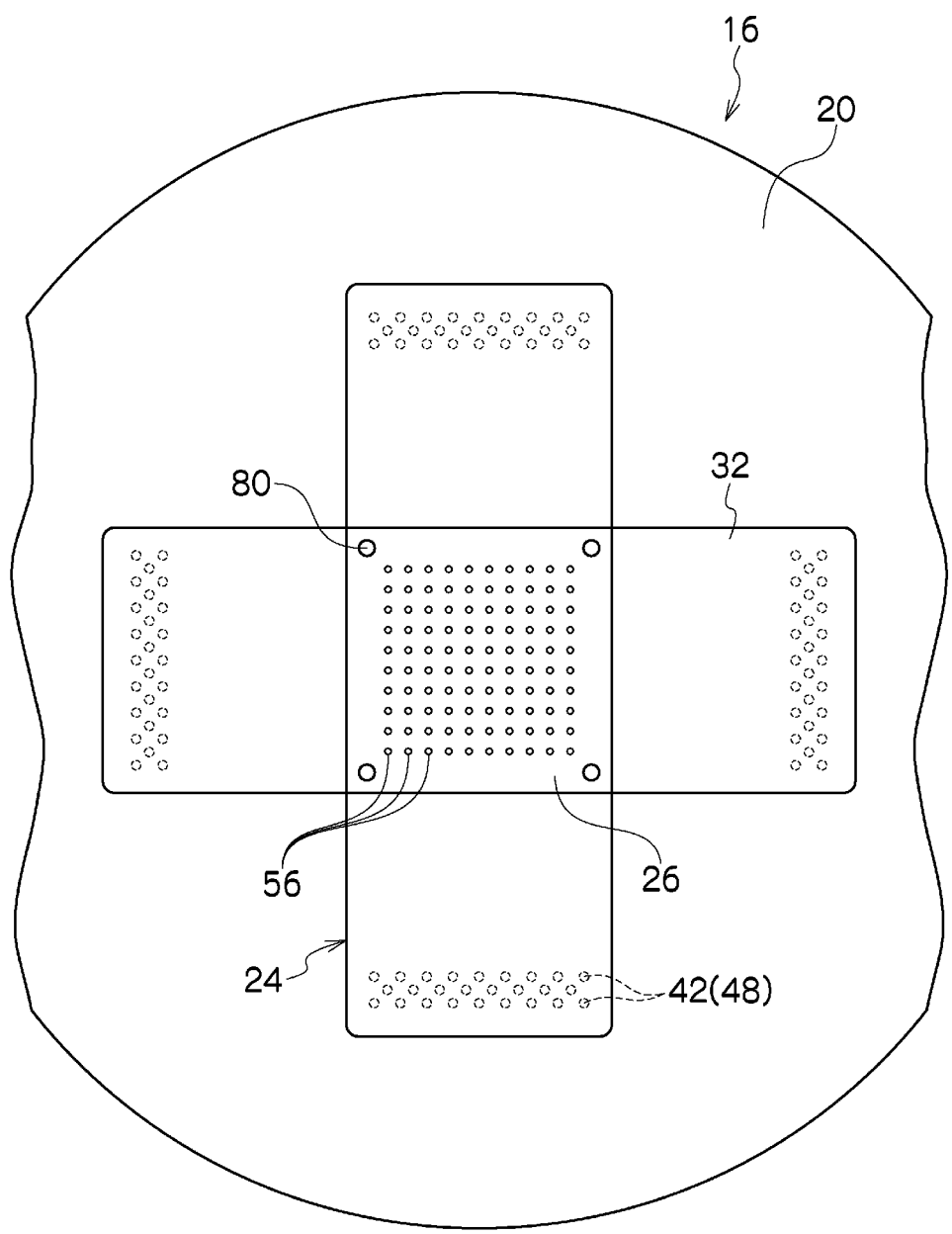
FIG. 2 is a partially enlarged bottom view of the electrical connecting apparatus in FIG. 1.
Figure 3:
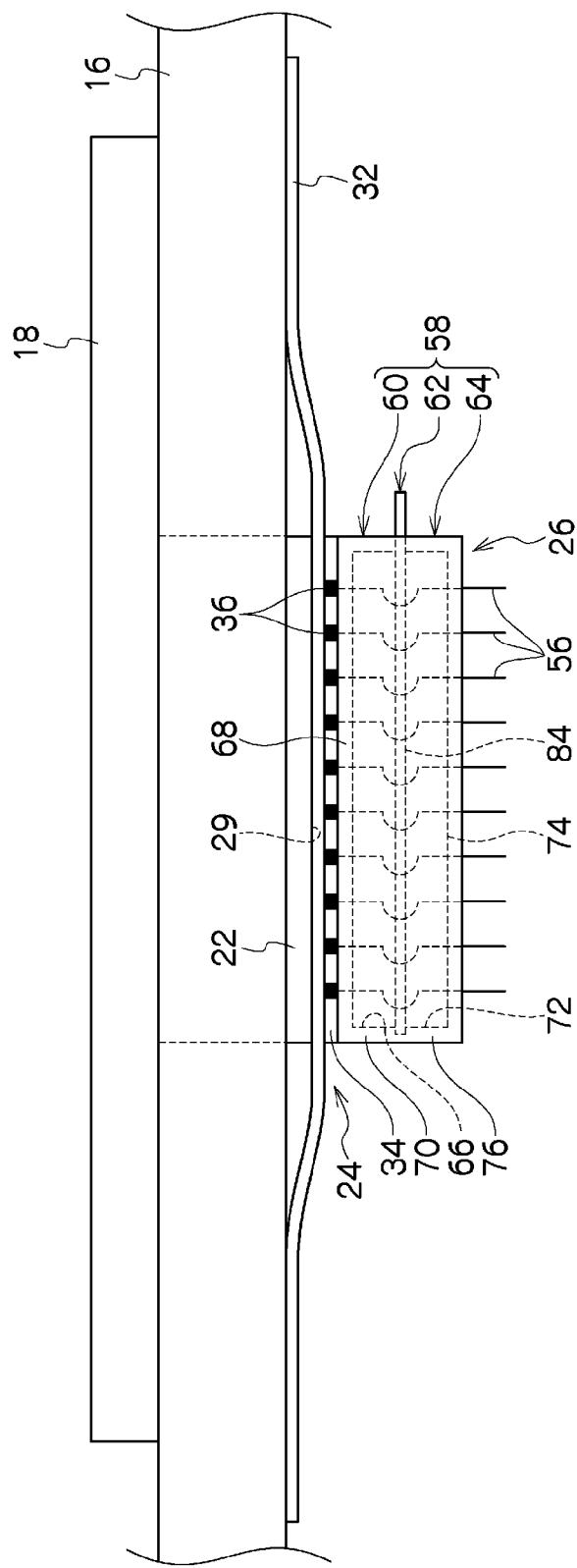
FIG. 3 is a partially enlarged front view of the electrical connecting apparatus in FIG. 1.

In the present invention, in FIG. 3, a right-left direction of the sheet surface is referred to as a right-left direction (or an X direction), a direction in the back side of the drawing sheet is referred to as a front-back direction (or a Y direction), and an up-down direction of the sheet surface (that is, a thickness direction of a board) is referred to an up-down direction (or a Z direction). However, the up-down direction in the present invention differs with the posture of a device under test at the time of an electrical test.

Accordingly, the up-down direction in the present invention is determined as any of the directions including the up-down direction, a reverse direction thereof, an actual horizontal direction, and an inclined direction inclined against the actual horizontal plane in accordance with the posture of the device under test in an actual electrical test.

About Electrical Connecting Apparatus

Referring to FIGS. 1 to 4, a testing system 10 is used in an electrical test in which a flat-plate-shaped device under test 12 as a semiconductor wafer is tested at a time or in several batches. The testing system 10 includes a chuck top 14 removably holding the device under test 12 in a state where electrodes 12a are directed upward and an electrical connecting apparatus 16 arranged on the upper side of the chuck top 14.

The electrical connecting apparatus 16 lies between a tester for a test (not shown) and the device under test 12 and transmits electrical signals to the tester and the device under test 12. The electrical signals for the test (voltage, current) include a test signal to be supplied to the device under test 12 (integrated circuits) for the purpose of obtaining a response signal and the response signal from the device under test 12 (integrated circuits) in response to the test signal.

The chuck top 14 is provided on a known test stage and has an upper surface removably holding the device under test 12. An example of a method for holding the device under test 12 to the chuck top 14 may be vacuum adsorption.

The chuck top 14 and the connecting apparatus 16 three-dimensionally relatively move in three directions of X, Y within an XY plane extending in the X and Y directions, and Z perpendicular to the XY plane and angularly relatively rotate around a theta axis extending in the Z direction. In general, the chuck top 14 three-dimensionally moves and angularly rotates around the theta axis relative to the electrical connecting apparatus 16.

The electrical connecting apparatus 16 includes a reinforcing plate 18, a second board or a wiring board 20 attached to the lower surface of the reinforcing plate 18, a fixing plate 22 penetrating the wiring board 20 in the up-down direction and attached to the lower surface of the reinforcing plate 18, a connecting board 24 attached to the lower surfaces of the wiring board 20 and the fixing plate 22, and a probe assembly 26 attached to the lower surface of the connecting board 24.

The reinforcing plate 18 is a known one made of a metal material such as a stainless steel plate (for example, refer to Japanese National Patent Appln. Public Disclosure No. 2008-145238). Such a reinforcing plate 18 has an external annular portion, an internal attachment portion extending in a circumferential direction in the inside of the annular portion, a plurality of connection portions integrally connecting the annular portion to the attachment portion, and a plurality of extension portions extending outward in the radial direction from the annular portion.

The wiring board 20 is a circular-plate-shaped multi-layered rigid board made of an electrical insulating material such as a glass-containing epoxy resin or a polyimide resin. The wiring board 20 has at the circumferential region on the upper surface a plurality of tester lands (not shown) to be electrically connected to the tester in a multiple manner and on the lower surface a plurality of first terminals (not shown) to be electrically connected to the tester lands via second internal wires 30.

The wiring board 20 has at the center an opening 28 passing therethrough in the up-down direction, and the fixing plate 22 is arranged to be inserted in the opening 28. The fixing plate 22 has a flat lower surface 29 to which the connecting board 24 is attached further on the lower side than the wiring board 20. The fixing plate 22 is attached at an upper surface thereof to the reinforcing plate 18 by a coupling means such as a screw member and a screw hole.

Figure 4:
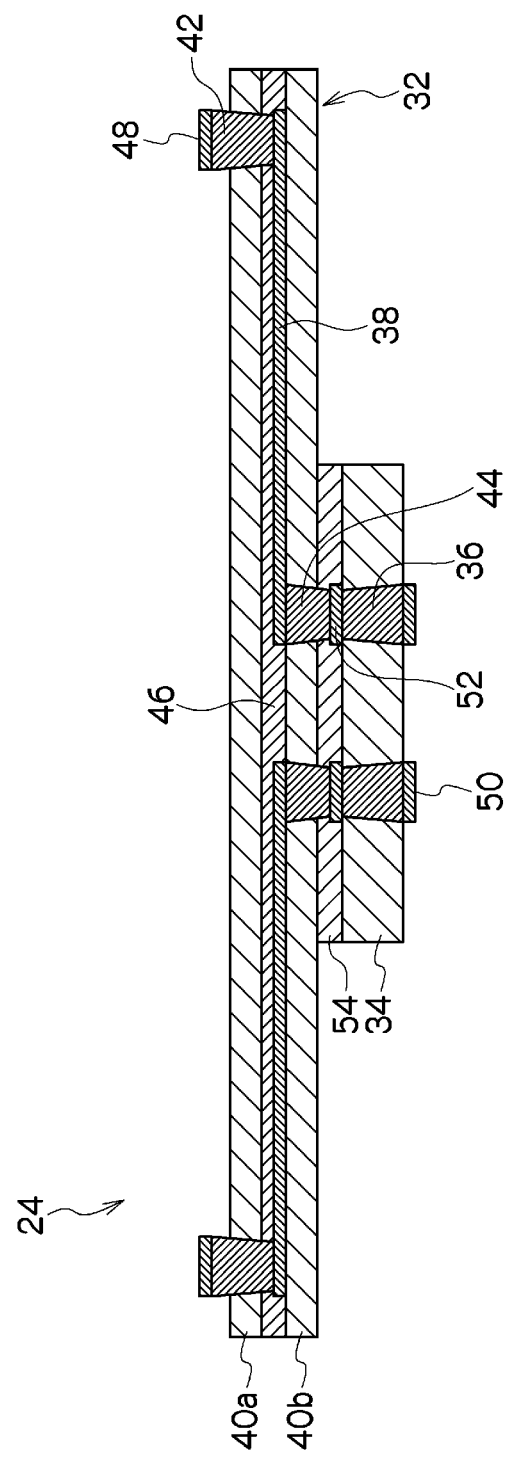
FIG. 4 is a schematic view showing a cross-section of a connecting board in FIG. 3.

Referring to FIG. 4, the connecting board 24 includes a resilient first board or a resilient board 32, a first sheet-like member or a resin sheet 34 attached to the lower surface of the resilient board 32, and a plurality of conductive paths 36 penetrating the resin sheet 34 in the up-down direction. The connecting board 24 is attached to the fixing plate 22 at the upper surface of the resilient board 32 corresponding to a position to which the resin sheet 34 is attached and is attached to the lower surface of the wiring board 20 at the outside upper surface of the resilient board 32 (refer to FIG. 1).

The resilient board 32 is a printed wiring board such as a flexible printed board (FPC: Flexible Printed Circuits) having inside a plurality of internal wires. Thus, the resilient board 32 includes a plurality of first internal wires 38, a pair of insulating sheets 40 (40a, 40b) such as polyimide sheets sandwiching the first internal wires 38 from the upper and lower sides, second terminals 42 penetrating the upper insulating sheet 40a in the up-down direction, and third terminals 44 penetrating the lower insulating sheet 40b in the up-down direction.

The lower insulating sheet 40b acts as a second sheet-like member lying between the first internal wires 38 and the resin sheet 34. The upper insulating sheet 40a is bonded to the lower insulating sheet 40b via an adhesive sheet 46 such as a thermosetting bonding sheet, and the first internal wires 38 are arranged between the pair of insulating sheets 40 (40a, 40b). The second terminals 42 and the third terminals 44 are electrically connected by the first internal wires 38.

Each of the second terminals 42 is covered at an upper end thereof with a metal film 48 excellent in corrosion resistance such as gold. The second terminals 42 are arranged at positions corresponding to the aforementioned first terminals of the wiring board 20, and the connecting board 24 is attached to the wiring board 20 so that the second terminals 42 may be connected to the aforementioned first terminals of the wiring board 20. The first terminals and the second terminals 42 are connected by a connecting means such as solder or a conductive adhesive.

Although the resilient board 32 has been described as a single-layered flexible printed board in the present embodiment, it may be a multi-layered wiring board into which a plurality of flexible printed boards are layered. This can increase the degree of freedom in arrangement of the first internal wires 38, that is, in wiring design.

The resin sheet 34 is bonded to the lower surface of the resilient board 32 or the lower insulating sheet 40b via an adhesive sheet 54 such as a bonding sheet. The resin sheet 34 is made of a photosensitive resin such as photosensitive polyimide. Such a photosensitive resin is exposed to light and heated and is not resilient after exposure to light and heating in general.

Each of the conductive paths 36 is made of a metal material such as nickel in the resin sheet 34 so as to penetrate the resin sheet 34 in the up-down direction. Since such conductive paths 36 can be formed in the photosensitive resin sheet 34 at a time with use of a photolithographic technique, positional accuracy of the plurality of conductive paths 36 depends on pattern accuracy of a photomask used in the photolithographic technique. In general, the pattern accuracy of the photolithographic mask is higher than that in a laser process or a drill process. Accordingly, the conductive paths 36 are formed with high positional accuracy.

Each of the conductive paths 36 is exposed at a lower end thereof to the lower surface of the connecting board 24, and the lower end is covered with a metal film 50 excellent in corrosion resistance such as gold. The conductive paths 36 are formed at positions corresponding to after-mentioned probes 56 of the probe assembly 26 and are arranged at regular intervals in the right-left direction and the front-back direction in the example shown in the figures (refer to FIG. 2).

The connecting board 24 may further have at the upper ends of the conductive paths 36 receiving portions 52 made of a metal material such as nickel. Each of the receiving portions 52 has a broader upper end surface than the upper end surface of the conductive path 36. As the receiving portion 52 receives and is connected to the third terminal 44, the conductive path 36 and the first internal wire 38 are electrically connected. Since the upper end surface of the receiving portion 52 is broader than the upper end surface of the conductive path 36, connection between the first internal wire 38 and the conductive path 36 becomes easy by connecting them via the receiving portion 52.

In the example shown in the figures, the conductive path 36 is in a truncated conical shape into which the top of a cone that is broader further on the lower side has been cut. However, it may be in a truncated pyramidal shape into which the top of another polygonal pyramid such as a triangular pyramid or a quadrangular pyramid has been cut or in a cylindrical shape such as a circular cylinder or a rectangular cylinder.

Figure 5:
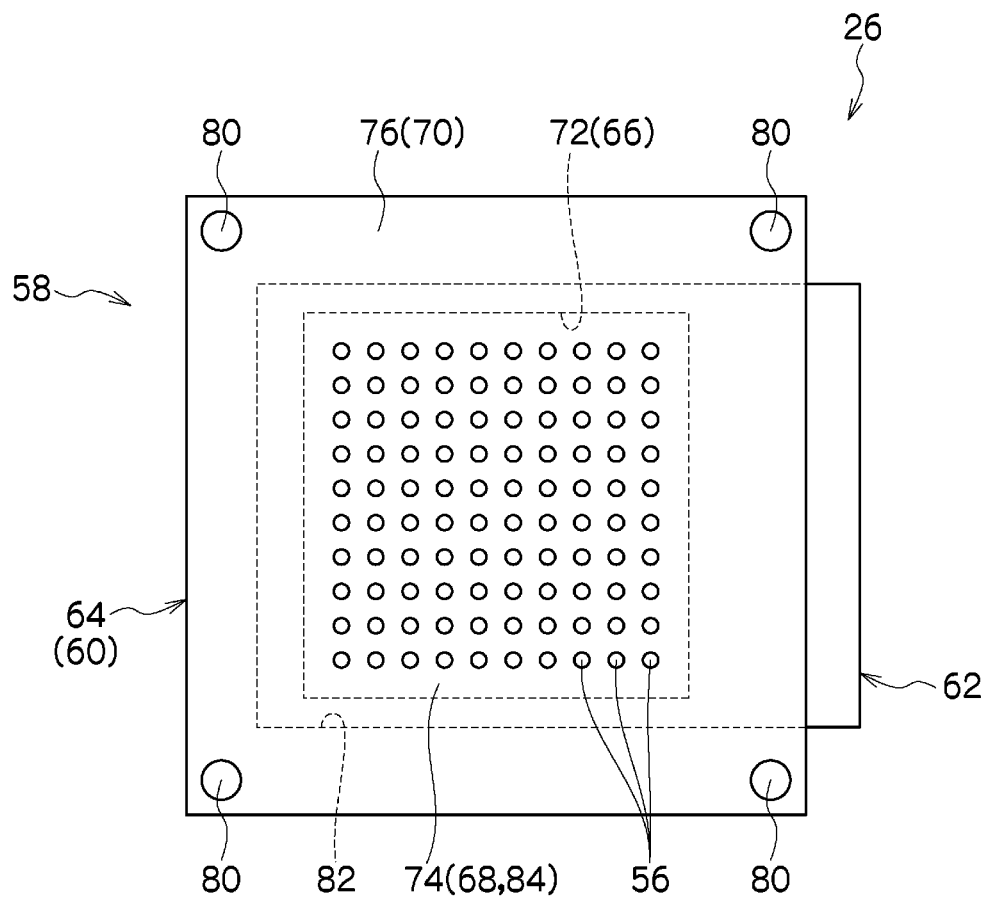
FIG. 5 is a bottom view showing a probe assembly in FIG. 3.

Referring to FIGS. 3 and 5, the probe assembly 26 is a known one including a plurality of probes 56 and a case 58 that the probes 56 penetrate in the up-down direction (for example, refer to Japanese National Patent Appln. Public Disclosure No. 2009-162483). The case 58 has a first box-shaped member 60, a plate-shaped member 62 arranged on the lower side of the first box-shaped member 60, and a second box-shaped member 64 arranged on the lower side of the plate-shaped member 62.

The first box-shaped member 60, the plate-shaped member 62, and the second box-shaped member 64 are formed to be a rectangular solid formed in a rectangular flat surface shape approximately equally sized to the resin sheet 34 by being piled in the up-down direction. The first box-shaped member 60, the plate-shaped member 62, and the second box-shaped member 64 are made of electrical insulating materials, respectively.

The first box-shaped member 60 has a recess 66 opened downward and is in a box shape opened downward. As for the first box-shaped member, the bottom portion of the recess 66 is a first plate-shaped portion 68, and the side portion of the recess 66 is a frame-shaped portion 70. The second box-shaped member 64 has a recess 72 opened upward so as to be in an upside-down manner of the first box-shaped member 60 and is in a box shape opened upward. As for the second box-shaped member 64, the bottom portion of the recess 72 is a third plate-shaped portion 74, and the side portion of the recess 72 is a frame-shaped portion 76.

The first and second box-shaped members 60 and 64 communicate with each other via the plate-shaped member 62 at the recesses 66 and 72 and are combined with each other at the frame-shaped portions 70 and 76 in a state where the first box-shaped member 60 is on the upper side while the second box-shaped member 64 is on the lower side. The first and second box-shaped members 60 and 64 are coupled with each other by a plurality of screw members 80 (refer to FIG. 5) penetrating the frame-shaped portion 76 and screwed into the frame-shaped portion 70. The second box-shaped member 64 has at the frame-shaped portion 76 a pair of grooves 82 opened upward and to the recess 72 and extending in the right-left direction.

The plate-shaped member 62 is formed in a plate shape or a sheet shape having a rectangular flat surface shape and is received in the grooves 82 at respective edges thereof in the front-back direction of the plate-shaped member 62 so as to be movable in the right-left direction. The center region of the plate-shaped member 62 acts as a second plate-shaped portion 84 spaced in the up-down direction against the first and third plate-shaped portions 68 and 74 since the plate-shaped member 62 is entirely in a plate or sheet shape.

The plurality of probes 56 are made of thin metallic wires such as tungsten wires and penetrate the first, second, and third plate-shaped portions to extend downward. In the probe assembly 26, by pulling the plate-shaped member 62 in the right direction, the plate-shaped member 62 is displaced in the right direction against the first and second box-shaped members easily to enable to curve the respective probes 56 in the same direction (that is, in the right direction) in the case 58.

By assembling the probe assembly 26 in this manner, since the displacing directions of the respective probes 56 are aligned even in a case where overdriving acts on the respective probes 56 when the electrical connecting apparatus 16 thrusts the lower ends of the respective probes 56 on the device under test 12, the probes 56 do not contact one another.

The probe assembly 26 is attached to the fixing plate 22 via the connecting board 24 by a plurality of screw members (not shown) penetrating the first and second box-shaped members 60 and 64, the plate-shaped member 62, and the connecting board 24 from a lower surface thereof and screwed into the fixing plate 22.

In general, in the manufacture of the electrical connecting apparatus 16, after the probe assembly 26 is assembled, the probe assembly 26 is attached to the connecting board 24 so that the respective probes 56 may abut on the lower ends of the corresponding conductive paths 36 of the connecting board 24.

Accordingly, since the conductive paths 36 are arranged in the connecting board 24 so that the mutual positional relationship may be highly accurate, a work of attaching the probe assembly 26 so as to make the probes 56 abut becomes easy. Also, when the lower end surface of the conductive path 36 has a broader area than the upper end surface of the probe 56 to abut on the conductive path 36, a work of making the probe 56 abut on the conductive path 36 becomes easy.

In the present embodiment, the probe 56 attached to the connecting board 24 has been described as a so-to-speak vertical needle-type probe made of a thin metallic wire and extending in the up-down direction. However, the probe 56 may be manufactured by a photolithographic technique and a deposition technique such as electroforming or sputtering.

Also, the probe 56 may be a so-to-speak cantilever-type probe attached to the lower surface of the connecting board 24 in a cantilevered manner or a so-to-speak pogo pin-type probe using a pogo pin as a probe. In any of these cases, the probe assembly 26 shall be a probe assembly suitable for supporting or attaching any of these probes.

About Method for Manufacturing Electrical Connecting Apparatus

Next, a method for manufacturing an electrical connecting apparatus according to the present invention shown in FIGS. 6 and 7 will be described.

First, as shown in FIG. 6(a), a metal plate such as a stainless steel plate is used as a base 100. On the base 100 is deposited a metal material such as copper by a deposition technique such as electroforming or sputtering to form a sacrificial layer 102. To the sacrificial layer 102 is thereafter attached a photosensitive resin sheet to form a resin layer 104. The resin layer 104 is the first sheet-like member or the resin sheet 34 in the electrical connecting apparatus 16. The resin layer 104 may be formed by printing and applying a photosensitive resin on the sacrificial layer 102 by a printing technique.

Subsequently, as shown in FIG. 6(b), a photomask 106 for photolithography is placed on the resin layer 104, and light is emitted from the upper side of the photomask 106. The photomask 106 has a light shielding pattern 108 that shields light at parts corresponding to the plurality of conductive paths 36 in the resin sheet 34. Thus, as for the resin layer 104, parts other than light shielding parts 110 shielded by the light shielding pattern 108 are exposed to the light.

The resin layer 104 is a so-to-speak negative-type photosensitive resin, in which a part exposed to light decreases its solubility in a developing solution and remains by development. However, the photosensitive resin may be a so-to-speak positive-type photosensitive resin, in which an exposed part is removed by development processing. In this case, the photomask 106 has a light shielding pattern that shields light at parts other than parts corresponding to the conductive paths 36.

Subsequently, as shown in FIG. 6(c), as for the resin layer 104, a part not exposed to light or the light shielding part 110 is removed by development processing, and a first through hole passing through the resin layer 104, that is, a recess 112 taking the form of the conductive path 36, is formed. Since a developing solution is injected to the resin layer 104 from the upper side in the development processing, the recess 112 is a recess that is broader further on the upper side.

Subsequently, as shown in FIG. 6(d), a first metal material such as nickel, that is, a metal material 114, is deposited in the recess 112 by a deposition technique such as a plating technique. Thereafter, for the purpose of corrosion resistance, a metal material 116 such as gold is thinly formed on the upper end surface of the metal material 114 by a deposition technique. The metal materials 114 and 116 are the conductive path 36 and the metal film 50 in the electrical connecting apparatus 16, respectively.

Subsequently, as shown in FIG. 6(e), the sacrificial layer 102 is removed by an etching technique, and the base 100 and the resin layer 104 are separated.

Subsequently, as shown in FIG. 6(f), the resin layer 104 is reversed so as to be upside down, that is, so as for the metal material 116 to contact the base 100, and is arranged on the base 100. At this time, another base may be used instead of the base 100.

Subsequently, as shown in FIG. 6(g), at a position corresponding to the metal material 114 is formed a metal material 118 such as nickel by a photolithographic technique and a deposition technique. The metal material 118 is the receiving portion 52 in the electrical connecting apparatus 16.

Subsequently, as shown in FIG. 6(h), a sacrificial layer 120 is formed around the resin layer 104 with use of a resin material such as a dry film sheet, and by attaching an adhesive sheet such as a thermosetting bonding sheet, an adhesive layer 122 is formed on the resin layer 104. The adhesive layer 122 is the adhesive sheet 54 in the electrical connecting apparatus 16.

Figure 7A:
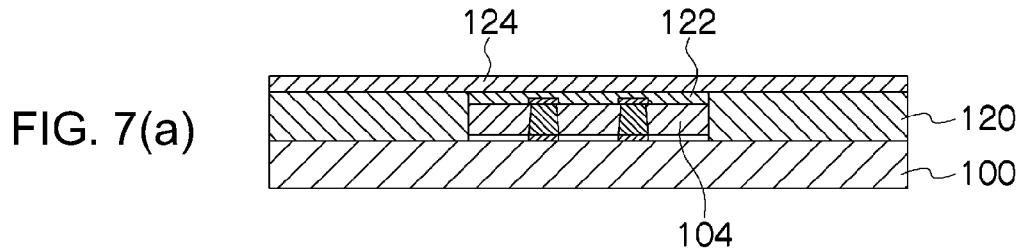
FIG. 7 describes the manufacturing steps following FIG. 6.

Subsequently, as shown in FIG. 7(a), a flexible second sheet-like member such as a polyimide sheet, that is, a resin sheet 124, is arranged on the sacrificial layer 120 and the adhesive layer 122. The resin sheet 124 is the lower insulating sheet 40b in the electrical connecting apparatus 16.

Figure 7B:
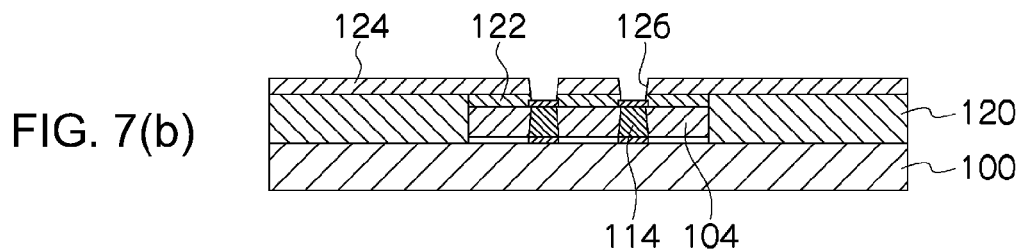

Subsequently, as shown in FIG. 7(b), at a part corresponding to the metal material 114 is formed a second through hole passing through the resin sheet 124 in the up-down direction, that is, a recess 126, by a laser process. The recess 126 has a smaller cross-sectional dimension than the cross-section of the metal material 118. Accordingly, when the metal material 118 formed in FIG. 6(g) has a larger upper end surface than the upper end surface of the metal material 114, tolerable misalignment in the laser process for forming the recess 126 is enlarged, which facilitates the laser process.

Figure 7C:
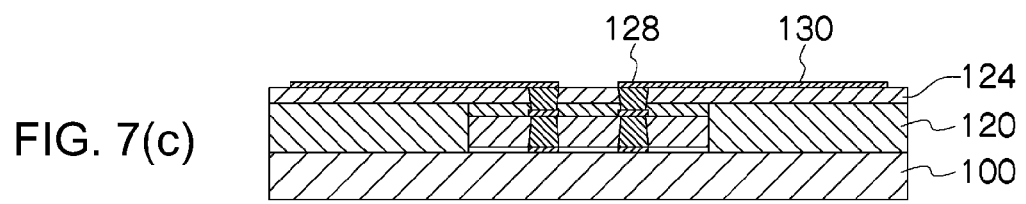

Subsequently, as shown in FIG. 7(c), a second metal material such as copper, that is, a metal material 128, is deposited in the recess 126 by a deposition technique. Thereafter, following the metal material 128, a metal material 130 such as copper is deposited by a deposition technique. The metal materials 128 and 130 are the third terminal 44 and the first internal wire 38 in the electrical connecting apparatus 16, respectively.

Figure 7D:
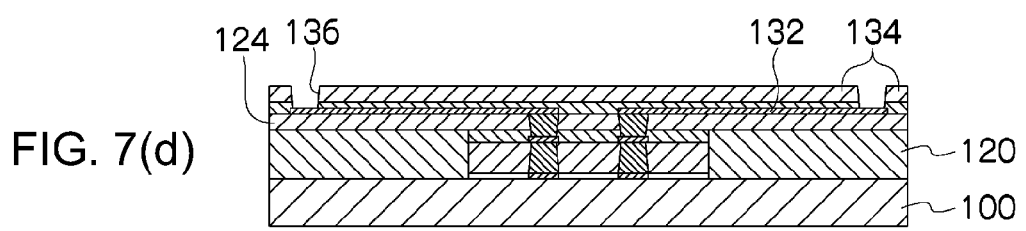

Subsequently, as shown in FIG. 7(d), by arranging an adhesive sheet such as a thermosetting bonding sheet, an adhesive layer 132 is formed on the resin sheet 124 and the metal material 130. Thereafter, a flexible resin sheet 134 such as a polyimide sheet is arranged on the adhesive layer 132. Thereafter, a recess 136 for the second terminal 42 is formed by a laser process.

The resin sheet 134 is made of an insulating material such as polyimide. The adhesive layer 132 and the resin sheet 134 are the adhesive sheet 46 and the upper insulating sheet 40a in the electrical connecting apparatus 16, respectively.

Figure 7E:
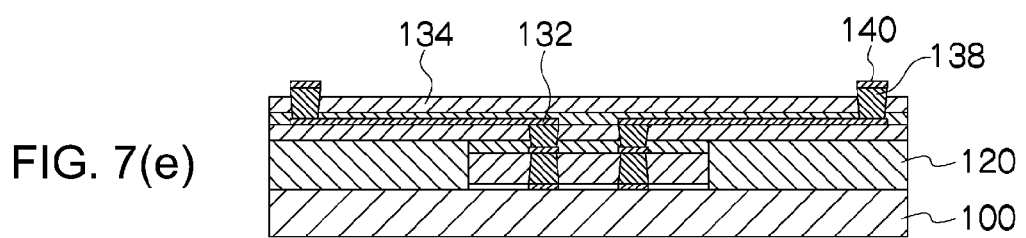

Subsequently, as shown in FIG. 7(e), a metal material 138 such as copper is deposited in the recess 136 by a deposition technique. The metal material 138 is deposited further to the upper side than the upper surface of the resin sheet 134. Thereafter, for the purpose of corrosion resistance, a metal material 140 such as gold is formed on the upper end of the metal material 138. The metal materials 138 and 140 are the second terminal 42 and the metal film 48 in the electrical connecting apparatus 16, respectively.

Figure 7F:
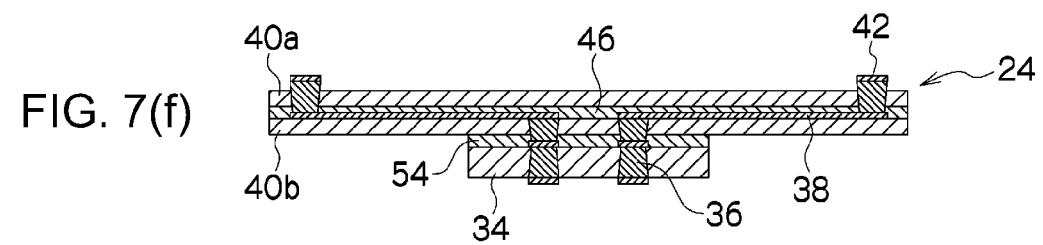

Subsequently, as shown in FIG. 7(f), the base 100 and the sacrificial layer 120 are removed and peeled to complete the connecting board 24.

When the resin layer 104 is developed at the step in FIG. 6(c) in the foregoing manufacturing steps, the light shielding part 110 of the resin layer 104 is removed by the developing solution injected from the upper side. Thus, the recess 112, which is broader further on the upper side of the resin layer 104, is formed. Accordingly, by turning the resin layer 104 upside down at the step in FIG. 6(f), the metal material 114 formed in the recess 112 is in a broader state further on the lower side.

By doing so, the conductive path 36 of the manufactured connecting board 24 is formed in a truncated pyramidal shape that is broader further on the lower side. Since the lower end surface of the conductive path 36 is connected to the probe 56 of the probe assembly 26, it is preferably broad in order to align the probe 56 and make the probe abut thereon.

On the other hand, since the upper end of the conductive path 36 is provided with the receiving portion 52 by the photolithographic technique and the deposition technique, alignment between the conductive path 36 and the receiving portion 52 is relatively easy. Thus, the upper end surface of the conductive path 36 may be smaller than the lower end surface. Accordingly, forming the conductive path 36 in a truncated pyramidal shape that is broader further on the lower side is preferable in manufacturing the electrical connecting apparatus 16.

In the foregoing manufacturing steps, by forming the insulating sheet 40b, the first internal wire 38, and the insulating sheet 40a sequentially after forming the conductive path 36 in the resin sheet 34, the resilient board 32 is formed on the resin sheet 34. However, the resilient board 32 may be formed on the resin sheet 34 by forming the resilient board 32 independently of the step of forming the conductive path 36 in the resin sheet 34 and attaching the resilient board 32 to the resin sheet 34 having formed therein the conductive path 36.

Figure 8:
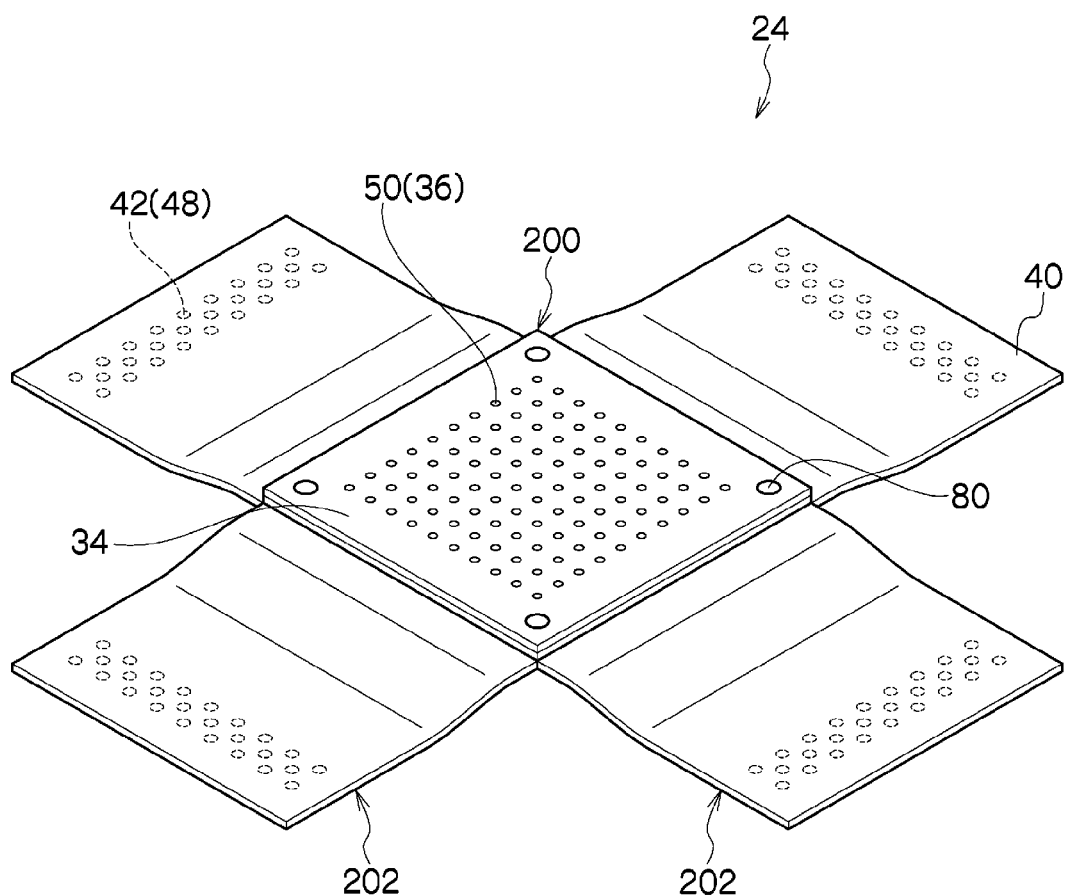
FIG. 8 is a perspective view showing the connecting board obtained by the manufacturing method according to the present invention.

The connecting board 24 manufactured in the foregoing manufacturing method includes a rectangular fourth plate-shaped portion 200 and four strip-shaped portions 202 extending from the respective sides of the fourth plate-shaped portion 200 as shown in FIG. 8. Since the fourth plate-shaped portion 200 includes the hardened resin sheet 34, it is not resilient. Each of the strip-shaped portions is formed by two polyimide sheets attached to each other, that is, the pair of insulating sheets 40, and the first internal wire 38 sandwiched between the pair of insulating sheets 40. Thus, the strip-shaped portion is resilient and acts as a so-to-speak FPC.

The connecting board 24 manufactured in the foregoing manufacturing method is attached to the wiring board 20 so that the second terminals 42 may be connected to the first terminals of the wiring board 20 to which the reinforcing plate 18 has been attached, and the probe assembly 26 is attached to the connecting board 24 so that the respective probes 56 may abut on the lower ends of the corresponding conductive paths 36 of the connecting board 24. By doing so, the electrical connecting apparatus 16 is manufactured.

As for the connecting board 24, a work of attaching the probe assembly 26 so as to support the probe assembly 26 becomes easy since the fourth plate-shaped portion 200 does not have high resiliency while a work of attaching the wiring board 20 so that the second terminals 42 may be connected to the first terminals of the wiring board 20 becomes easy since each of the strip-shaped portions 202 has resiliency.

INDUSTRIAL APPLICABILITY

The present invention is not limited to the above embodiments but may be altered in various ways without departing from the spirit and scope of the present invention.

What is claimed is:

1. An electrical connecting apparatus comprising:
a connecting board to which a plurality of probes are connected, the connecting board including a first board having a plurality of first internal wires and having resiliency, a first sheet-like member arranged on a lower side of the first board and made of a photosensitive resin, and a plurality of conductive paths passing through the first sheet-like member in an up-down direction and connected at upper ends thereof to the first internal wires; and
the probes connected to lower ends of the conductive paths.

2. The electrical connecting apparatus according to claim 1, further comprising a second board arranged on an upper side of the connecting board and having a plurality of second internal wires, wherein the first internal wires are electrically connected to the second internal wires.

3. The electrical connecting apparatus according to claim 2, further comprising a case arranged on a lower side of the connecting board and having arranged therein the probes,
wherein the case includes a first box-shaped member having a first plate-shaped portion, a plate-shaped member having a second plate-shaped portion spaced on a lower side of the first plate-shaped portion, and a second box-shaped member having a third plate-shaped portion spaced on a lower side of the second plate-shaped portion, and
wherein each probe extends downward from the lower end of the conductive path and penetrates the first, second, and third plate-shaped portions.

4. The electrical connecting apparatus according to claim 3, wherein the conductive path is formed in a truncated pyramidal shape that is broader further on a lower side.

5. The electrical connecting apparatus according to claim 4, wherein the lower end of the conductive path has a flat lower end surface, and the probe has a flat upper end surface to be connected to the lower end surface, and
wherein the lower end surface has a broader area than the upper end surface.

6. A method for manufacturing an electrical connecting apparatus according to claim 1, comprising:
- a first step of forming in a first sheet-like member made of a photosensitive resin a plurality of first through holes passing through the first sheet-like member at a time with use of a photolithographic technique;
- a second step of filling a first metal material in the first through holes; and
- a third step of forming on the first sheet-like member a first board having a plurality of first internal wires to be electrically connected to the first metal material and having resiliency.

7. The method for manufacturing an electrical connecting apparatus according to claim 6, wherein the first board has a second sheet-like member lying between the first internal wires and the first sheet-like member, and
- wherein the third step includes a fourth step of forming second through holes passing through the second sheet-like member in an up-down direction at positions corresponding to the first metal material and a fifth step of filling in the second through holes a second metal material to be electrically connected to the first metal material.

8. The method for manufacturing an electrical connecting apparatus according to claim 7, further comprising a sixth step of forming on an upper surface of the second sheet-like member the first internal wires to be electrically connected to the first metal material via the second metal material.

9. The method for manufacturing an electrical connecting apparatus according to claim 8, further comprising between the second and third steps a seventh step of turning the first sheet-like member upside down.

\* \* \* \* \*